United States Patent [19]

Rohsler et al.

[11] Patent Number: 4,642,671

[45] Date of Patent: Feb. 10, 1987

[54] SEMI-CONDUCTOR ASSEMBLY

[75] Inventors: Ivor C. Rohsler, Harborne; Anthony F. C. Clark, Stratford-upon-Avon, both of England

[73] Assignee: Lucas Industries Public Limited Company, Birmingham, England

[21] Appl. No.: 518,106

[22] Filed: Jul. 28, 1983

[30] Foreign Application Priority Data

Jul. 29, 1982 [GB] United Kingdom ............... 8221973

[51] Int. Cl.⁴ .......................................... H01L 23/42
[52] U.S. Cl. ...................................... 357/79; 357/75; 357/76; 357/81
[58] Field of Search ..................... 357/74, 75, 76, 79, 357/81

[56] References Cited

U.S. PATENT DOCUMENTS

| | | | |
|---|---|---|---|
| 3,743,893 | 7/1973 | Yamamoto | 317/234 R |
| 3,844,029 | 10/1974 | Dibugnara | 357/74 |
| 3,992,717 | 11/1976 | Rice | 357/74 |
| 4,245,232 | 1/1981 | Bacuvier | 357/76 |
| 4,305,087 | 12/1981 | Wislocky | 357/74 |
| 4,313,128 | 1/1982 | Schlegel et al. | 357/74 |
| 4,314,271 | 2/1982 | Heyke et al. | 357/76 |
| 4,492,975 | 1/1985 | Yamada et al. | 357/76 |
| 4,518,983 | 5/1985 | Longenecker et al. | 357/81 |
| 4,538,171 | 8/1985 | Stevens et al. | 357/81 |

FOREIGN PATENT DOCUMENTS 1914398 10/1969 Fed. Rep. of Germany.
2617335 3/1977 Fed. Rep. of Germany.
1192169 5/1970 United Kingdom.

Primary Examiner—William L. Sikes
Assistant Examiner—Frank González
Attorney, Agent, or Firm—Staas & Halsey

[57] ABSTRACT

A semi-conductor assembly is provided having first, second and third electrically conductive members, and a semi-conductor diode positioned between said first and second conductive members. The diode has its anode region electrically connected to said first conductive member and its cathode region electrically connected to the second conductive member. A semi-conductor thyristor positioned between said second and third conductive members, said semi-conductor thyristor is having its anode terminal region connected to the second conductive member and its cathode terminal region connected to the third conductive member. The third and first electrically conductive members are electrically interconnected, and at least one of said first, second and third electrically conductive members constitutes a heat sink for the assembly. The assembly further includes a connector for making an electrical connection to the gate terminal region of the thyristor.

6 Claims, 3 Drawing Figures

SEMI-CONDUCTOR ASSEMBLY

BACKGROUND OF THE INVENTION

This invention relates to a semi-conductor assembly of the kind including, as active components, a thyristor and a diode, the diode having its anode connected to the cathode of the thyristor and its cathode connected to the anode of the thyristor.

One practical application of a semi-conductor assembly of the kind specified is in a forced commutation circuit, for example, a thyristor chopper circuit for controlling operation of an electric motor driving an electrically propelled vehicle. In such an application the active components of the semi-conductor assembly must be capable of dealing with very high currents (for example in excess of 150 amps) and a problem exists in producing a suitable assembly at reasonable cost. For example, in one suitable known form of semi-conductor assembly of the kind specified the thyristor and diode are integrated in a single semi-conductor chip, the diode being in annular form encircling the thyristor. It is found however that the manufacture of such an integrated device results in a high percentage of faulty components and thus manufacturing costs are high. An alternative approach is to use discrete thyristor and diode packages, but in view of the relatively massive nature of the package, which is necessary in order to provide the required high current rating, it is found that the electrical connections between the discrete diode and thyristor packages have an undesirably large inductance.

SUMMARY OF THE INVENTION

It is an object of the present invention to minimize or mitigate the aforementioned disadvantages of the prior art arrangements.

A semi-conductor assembly according to the present invention includes first, second and third electrically conductive members; a semi-conductor diode positioned between said first and second conductive members, and having its anode region electrically connected to one of said first and second conductive members and its cathode region electrically connected to the other of said first and second conductive members; a semi-conductor thyristor positioned between said second and third conductive members, said semi-conductor thyristor having one of its anode and cathode terminal regions connected to the second conductive member and the other of its anode and cathode terminal region connected to the third conductive member, said third and first electrically conductive members being electrically interconnected, and the terminal region of the semi-conductor diode which is electrically connected to the second conductive member being of opposite polarity to the thyristor terminal region which is also electrically connected to the second conductive member, at least one of said first; second and third electrically conductive members constituting a heat sink for the assembly; and means for making an electrical connection to the gate terminal region of the thyristor.

Preferably said thyristor and said diode are mounted on said second member so as to be substantially in axial alignment.

Preferably said second conductive member is the heat sink of the assembly.

Alternatively said first and third conductive members constitute the heat sink of the assembly.

Alternatively all three of said first, second and third conductive members form parts of the heat sink of the assembly.

Desirably the cathode of said diode and the anode of said thyristor are each electrically connected to said second conductive member.

Preferably the first and third conductive members are urged towards one another to trap the thyristor, the second conductive member, and the diode therebetween.

Conveniently said first and third conductive members are joined to one another by electrically conductive fastening devices which extend through the second conductive member but are electrically insulated therefrom.

Conveniently said devices are screw threaded.

Preferably resilient means is provided urging said first and third conductive members towards one another.

BRIEF DESCRIPTION OF THE DRAWINGS

One example of the invention is illustrated in the accompanying drawings wherein.

DETAILED DESCRIPTION OF THE PREFERRED EMBODIMENTS

Figure 1:
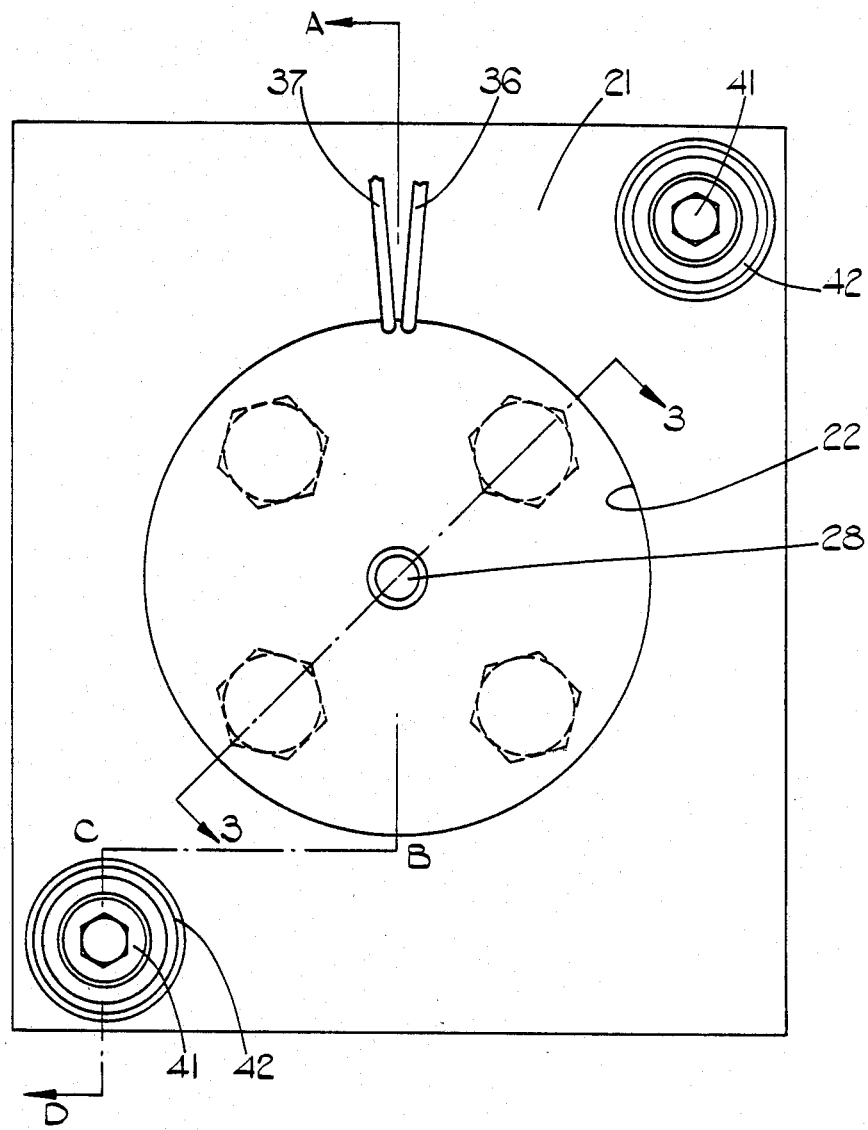
FIG. 1 is a plan view of a semi-conductor assembly.

Referring to the drawings, the semi-conductor assembly includes first, second and third electrically conductive members 11, 12, 13 arranged one above the other, a semi-conductor device in the form of a diode 14 positioned between the members 11 and 12, and a further semi-conductor device in the form of a thyristor 15 positioned between the members 12 and 13.

The second electrically conductive member 12 is defined by a rectangular aluminium block 21 having a cylindrical recess 22 extending inwardly from one face. The base of the recess 22 is formed with a centrally disposed upstanding circular plateau 23 upon the upper surface of which is positioned a molybdenum disc 24. The semi-conductor diode device 14 is seated on the disc 24 with its cathode in engagement with, and therefore in electrical connection with, the disc 24. The upwardly presented anode face of the diode 14 is engaged by a silver disc 25 and overlying the silver disc 25 is the first conductive member 11 in the form of a diaphragm plate formed from annealed copper. The diaphragm plate 11 has a circular recess 16 in its face remote from the washer 25, and within the recess 16 is a disc spring 26. Overlying the face of the plate 11 remote from the diode 14 is a top pressure plate 27 formed from brass. The central region of the disc spring 26 engages the base of the recess in the plate 11, and the periphery of the spring 26 engages the undersurface of the pressure plate 27. An electrically conductive bolt 28 extends upwardly through the pressure plate 27, the head of the bolt 28 being received in the recess 16. It will be recognised that the plate 27 and the plate 11 are in contact, and so are electrically interconnected, and similarly by virtue of their engagement with the bolt 28, the bolt 28 is electrically connected to the plates 11 and 27. Since the plate 11 is in contact with the silver washer 25 which in turn is in contact with the anode of the diode 14 then the bolt 28 constitutes an anode terminal for the diode 14.

Figure 3:
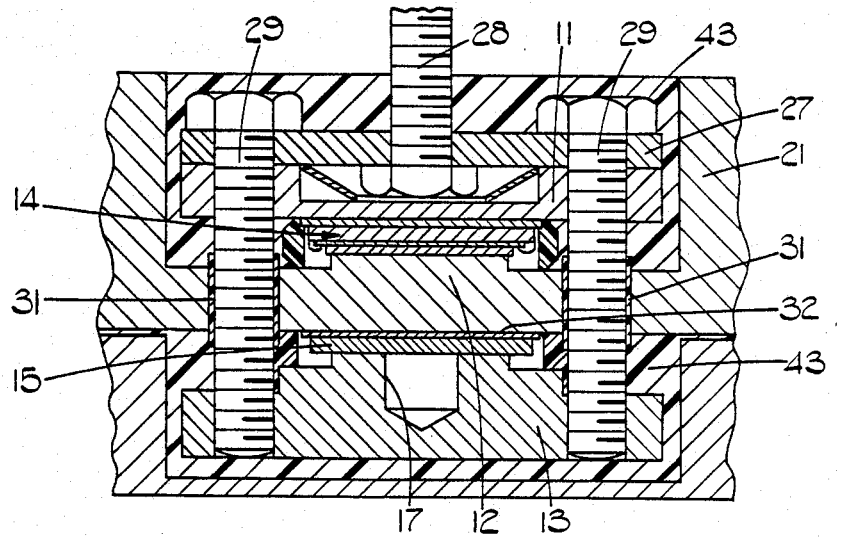
FIG. 3 is a sectional view on the line 3—3 of FIG. 1.

As best seen in FIG. 3 four fixing bolts 29 are equiangularly spaced around the plate 27, and extend downwardly through corresponding apertures in the plates 27, and 11, and the base region of the block 21 to make screw-threaded engagement with corresponding screw-threaded bores in a bottom pressure plate positioned beneath the block 21 and constituting the third conductive member 13. The bottom pressure plate 13 is formed from brass, and since the bolts 29 are electrically conductive then the bottom pressure plate 13 and the top pressure plate 27 are electrically interconnected. The bores in the base region of the block 21 through which the bolts 29 pass are provided with electrically insulating lining sleeves 31 whereby the bolts 29 are electrically insulated from the second conductive member 12 and thus the block 21.

Axially aligned with the discs 24, 25 and the diode 14, but lying between the conductive member 12 and the bottom pressure plate 13 is a silver washer 32 one face of which engages the second conductive member 12. Between the lower face of the washer 32 and the upper face of the pressure plate 13 and in axial alignment with the diode 14 is the semi-conductor thyristor device 15 the anode of which is in contact with the silver washer 32. The opposite face of the thyristor 15 is the cathode face of the thyristor, but within the cathode face is a surface area of the gate of the thyristor. The gate area is a circular area centrally disposed on the cathode face and the bottom pressure plate 13 has therein a centrally disposed circular recess 17 which ensures that the surface area of the pressure plate 13 which engages the cathode face of the thyristor 15 is an annular area engaging only the cathode of the thyristor. Thus the gate contact area of the thyristor corresponds to the recess 17.

Figure 2:
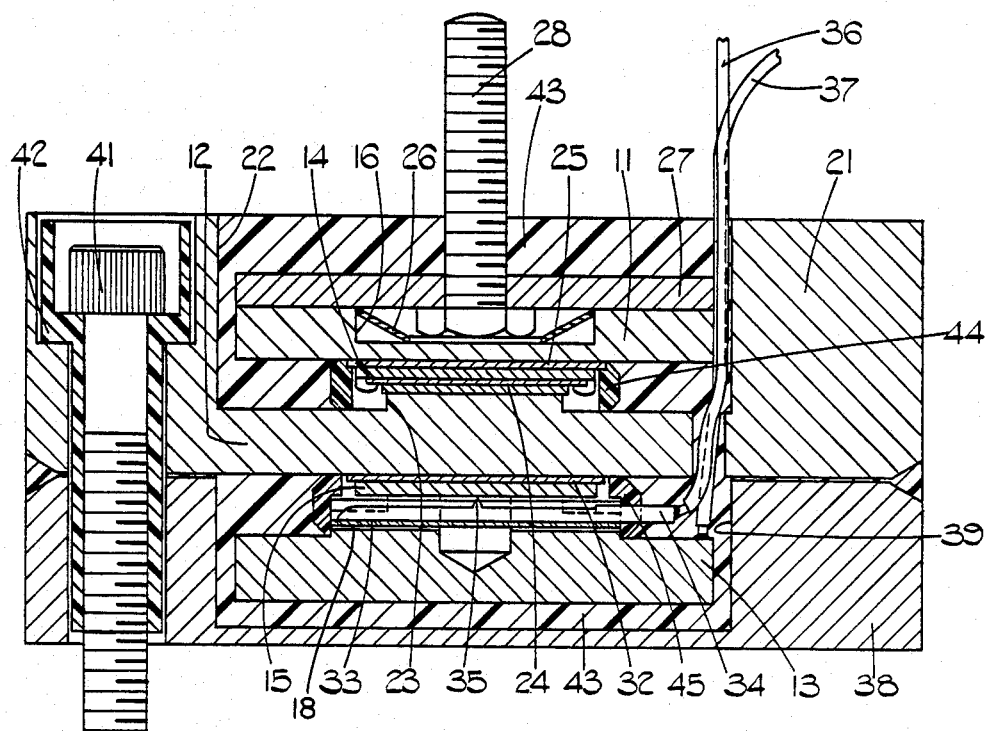
FIG. 2 is a sectional view on the line A B C D of FIG. 1.

In order to provide an electrical connection to the gate area of the thyristor the upstanding area of the pressure plate 13 which engages the thyristor is provided with a diametrically extending slot 18 which is lined with an electrically insulating member 33 of U-shaped cross-section. Received by the member 33 so as to be insulated from the pressure plate 13 is a beryllium/copper beam connector 34 of known form. The beam connector 34 has a centrally disposed upward extension 35 (FIG. 2) which engages and makes electrical connection to the gate region of the thyristor 15. An electrically conductive lead 36 is connected at one end to the beam connector 34. Thus the beam connector 34 is supported by the pressure plate 13 and makes electrical connection to the gate region of the thyristor, but is electrically insulated by the member 33 from the plate 13.

It will be recognised that the bolts 29 secure the assembly together in that they exert an axial clamping force pulling the pressure plate 13 towards the pressure plate 11 and thus trapping the intervening components on both sides of the second conductive member 12. The cathode of the diode 14 and the anode of the thyristor 15 are electrically interconnected by means of the second conductive member 12, and the anode of the diode 14 which is connected to the plate 11 is electrically connected by means of the bolts 29 to the cathode of the thyristor 15 by virture of the engagement of the bolts 29 with the plate 13. Thus the block 21 constitutes one terminal of the semi-conductor assembly, being electrically connected to the cathode of the diode and the anode of the thyristor, while the bolt 28 constitutes a second terminal of the assembly being electrically connected to the anode of the diode and the cathode of the thyristor. The thyristor gate connection of the assembly is made by way of the lead 36.

Desirably a lead 37 is electrically connected to the pressure plate 13 to provide an additional electrical connection to the cathode of the thyristor 15. The assembly is completed by a further rectangular aluminium block 38 which lies beneath the block 21 and has therein a recess 39 receiving the thyristor and pressure plate 13 part of the assembly. The block 38 is electrically insulated from the block 21, and assembly mounting bolts 41 pass downwardly through the blocks 21 and 38 to make screw-threaded connection with a component upon which the assembly is mounted in use. The bolts 41 are electrically insulated from the blocks 21 and 38 by means of electrically insulating liners 42. Thus the securing bolts 41 do not electrically connect any part of the assembly to the component upon which the assembly is mounted.

In order to provide protection for the devices 14 and 15 the recesses 22 and 39 are filled with an electrically insulating but thermally conductive encapsulant 43, conveniently an epoxy resin material loaded with aluminium particles. A suitable loaded resin material is available from Emerson & Cuming (UK) Limited, as "Eccobond 28481-6". In order to ensure that the epoxy resin does not actually contact the semi-conductor devices 14, 15 when it is introduced into the recesses 22, 39 rubber sealing elements 44, 45 are incorporated during construction of the assembly to encircle respectively the diode 14 and the thyristor 15. The sealing ring 44 is thus pinched between the top pressure plate 11 and the base of the recess in the block 21 while the sealing ring 45 is pinched between the base of the block 21 and the bottom pressure plate 13. The sealing rings 44, 45 constitute a physical barrier preventing the encapsulating 43 from flowing onto the exposed regions of the semi-conductor devices.

Desirably either or both of the mutually presented faces of the blocks 21 and 38 are provided with an anodized surface layer which serves to insulate the blocks from one another. As an alternative however the encapsulant 43 extends between the blocks 21 and 38 to provide an electrical insulation between the blocks.

It will be recognised that during construction of the assembly the tightening of the bolts 29 is controlled so that a desired axial loading is applied to the assembly by way of the spring 26 to ensure good electrical connection between the various components at the appropriate places. The semi-conductor devices 14, 15 are effectively unpackaged semi-conductor chips although their contact regions will have been provided with appropriate metallizing layers to ensure good electrical connection to the adjacent components.

It will be recognised that since both semi-conductor devices are in intimate contact with the base region 12 of the block 21 then the block 21 constitutes the primary heat sink of the assembly. However, the block 38 is of course in intimate thermal (but not electrical) contact with the block 21 and thus effectively constitutes an increase in the mass of the block 21 for heat sink purposes. Desirably the exposed surface of the block 21 will be provided with an electrically insulating coating either by anodizing, or by covering with an insulating material.

While it is desirable to utilize the intermediate metallic member 12 as the primary heat conductive path to the heat sink of the assembly it is to be understood that the alumina loading in the encapsulant 43 ensures that the encapsulant has high thermal conductivity, and thus heat is conducted from the devices 14, 15 to the blocks 21 and 38 through the plates 11, 13 and 27 and through the encapsulant 43. Moreover, it is to be recognised that if desired the blocks 21 and 38 could be integral parts of the diaphragm plate 11 and pressure plate 13 respectively and having no connection to the intermediate conductive member 12. With such an arrangement a separate electrical connection must be brought out from the member 12. Thus the heat sink can be provided primarily by the second conductive member 12 as is the case with the example illustrated, or alternatively could be provided by the first and third conductive members 11, 13, or as a further alternative could be provided by any one of the first, second and third conductive members alone or in combination with any one of the others.

In situations where the bulkiness of the heat sink arrangements described above is unattractive from, for example, the point of view of accommodation and mounting of the construction then it is to be understood that fluid cooling may be provided to reduce the heat sink bulk. Thus the members constituting the heat sink may be drilled to receive a flow of cooling fluid or may be mounted in thermal contact with conduits carrying cooling fluid (for example one or more heat pipes).

We claim:

1. A semi-conductor assembly, comprising:
   (a) first, second and third electrically conductive members;
   (b) a semi-conductor diode positioned between said first and second conductive members,
   wherein the anode region of the diode is electrically connected to one of said first and second conductive members and the cathode region is electrically connected to the other of said first and second conductive members;
   (c) a semi-conductor thyristor positioned between said second and third conductive members,
   wherein one of said semi-conductor thyristor anode and cathode terminal regions is connected to the second conductive member and the other of the anode and cathode terminal regions is connected to the third conductive member, and
   wherein said third and first electrically conductive members are electrically interconnected, and the terminal region of the semi-conductor diode which is electrically connected to the second conductive member is of opposite polarity to the thyristor terminal region which is also electrically connected to the second conductive member,
   (d) means for making an electrical connection to a gate terminal region of the thyristor; and
   (e) heat sink means including said second conductive member for accepting heat from said diode and thyristor,
   wherein said heat sink means includes thermally conductive block means having first and second opposed recesses,
   wherein said second conductive member forms a boundary wall separating said first and second recesses, said first recess houses said diode, said second recess houses said thyristor, and said first and third conductive members are resiliently biased towards one another so that said diode and said thyristor are loaded against said second conductive member,
   wherein said block means is of two part construction and said second conductive member is integral with one of the two parts, and
   wherein said first conductive member is housed in said first recess and said third conductive member is housed in said second recess.

2. An assembly as claimed in claim 1, wherein said first and third conductive members form parts of said heat sink means.

3. An assembly as claimed in claim 1, wherein said thyristor and said diode are mounted on said second conductive member so as to be substantially in axial alignment.

4. An assembly as claimed in claim 1, wherein the cathode of said diode and the anode of said thyristor are each electrically connected to said second conductive member.

5. An assembly as claimed in claim 1, wherein said first and third conductive members are joined to one another by electrically conductive fastening devices which extend through the second conductive member but are electrically insulated therefrom.

6. An assembly as claimed in claim 5, wherein said electrically conductive fastening devices are screw threaded.

* * * * *